(12) United States Patent
Nishimoto et al.

(10) Patent No.: US 7,498,872 B2
(45) Date of Patent: Mar. 3, 2009

(54) TRANSISTOR DEVICES CONFIGURED TO OPERATE ABOVE A FIRST CUTOFF FREQUENCY

(75) Inventors: Matt Yuji Nishimoto, Torrance, CA (US); Gregory Hoke Rowan, Redondo Beach, CA (US); Jeffrey Ming-Jer Yang, Cerritos, CA (US); Yun-Ho Chung, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 107 days.

(21) Appl. No.: 11/413,833

(22) Filed: Apr. 28, 2006

(65) Prior Publication Data

US 2007/0252643 A1 Nov. 1, 2007

(51) Int. Cl.
*H01L 29/00* (2006.01)

(52) U.S. Cl. .............................. 327/574; 716/2; 257/288

(58) Field of Classification Search ........................ None
See application file for complete search history.

(56) References Cited

U.S. PATENT DOCUMENTS

| | | | |
|---|---|---|---|
| 4,929,986 A | | 5/1990 | Yoder |
| 5,519,358 A | * | 5/1996 | Tserng ........................ 330/307 |
| 6,166,436 A | | 12/2000 | Maeda et al. |
| 6,269,277 B1 | | 7/2001 | Hershenson et al. |
| 2002/0083406 A1 | * | 6/2002 | Tsai et al. ..................... 716/10 |
| 2005/0028117 A1 | | 2/2005 | Yokoyama et al. |

OTHER PUBLICATIONS

Sedra A S et al: "*Microelectronic Circuits*"; 1987, Microelectronic Circuits, pp. 845-855, XP002454231; whole document.
Sebastien Mons et al: "*A Unified Approach for the Linear and Nonlinear Stability Analysis of Microwave Circuits Using Commercially Available Tools*"; IEEE Transactions on Microwave Theory and Techniques, IEEE Service Center, Piscataway, NJ, US vol. 47, No. 12, Dec. 1999, XP011037829, ISSN: 0018-9480; whole document.
International Search Report for corresponding PCT/US2007/066260; completed Oct. 9, 2007 by Claud Anticoli of the EPO.
Meliani, et al.: *92 GHz Cut-off Frequency InP Double Channel HEMT Based Coplanar Distributed Amplifier for 40 Gbit/s Applications and Beyond*; Alcatel R&I, Route de Nozay, F- 91461 Marcoussis, France; ESSCIRC 2002; pp. 615-617.

* cited by examiner

*Primary Examiner*—Evan Pert
*Assistant Examiner*—Ben P Sandvik
(74) *Attorney, Agent, or Firm*—Tarolli, Sundheim, Covell & Tummino LLP (57) ABSTRACT

Transistor devices are provided configured to operate at frequencies above a typical first cutoff frequency. In one aspect, a method is provided for configuring a transistor device to operate above a first cutoff frequency. The method comprises selecting a desired operating frequency range and a desired output power for a transistor associated with the transistor device, analyzing the effects of phase velocity mismatch on the overall gain of a plurality of different sized transistors, and evaluating the primary and secondary gain regions of the plurality of different sized transistors. The method further comprises selecting a transistor sized to provide the desired output power at or close to the desired operating frequency range based on the analysis of the phase velocity mismatch and the evaluation of the primary and secondary gain regions.

18 Claims, 5 Drawing Sheets

TRANSISTOR DEVICES CONFIGURED TO OPERATE ABOVE A FIRST CUTOFF FREQUENCY

TECHNICAL FIELD

The present invention relates to electronics, and more particularly to transistor devices configured to operate above a first cutoff frequency.

BACKGROUND

Transistors are the building blocks of most electronic circuits, such as amplifiers, filters, oscillators, logic gates, switching circuitry, memory devices, programmable logic arrays, and gate arrays to name a few. Transistors are employed in the simplest amplifier or oscillator to the most elaborate digital computer. Integrated circuits are merely an array of transistors and other components built from a single chip of semiconductor material. These electronic circuits are employed in many electronic systems, such as in transmitters and receivers for all types of communication and radar systems.

The transistor is a device that can amplify an input signal to produce a higher power output signal. Transistors come in a variety of different transistor types such as bipolar junction transistors (BJTs), junction field-effect transistors (JFETs), metal-oxide-semiconductor field-effect transistors (MOSFETS), heterojunction bipolar transistors (HBTs) and high electron mobility transistors (HEMTs). Each of these transistor types have unique operating characteristics, and can be selected for a particular application based on these operating characteristics. Each of these transistor types are modeled in a similar manner, such that they have an operating bandwidth that is limited by a cutoff frequency or maximum frequency in which the output gain of the transistor falls below unity.

The desire for systems to provided wider operation bandwidths drive the transistors to operate at higher carrier frequencies, such as microwave frequencies (wavelength less than 1 micrometer) or millimeterwave frequencies (wavelength less than 1 millimeter). However, since the cutoff frequency is related to the intrinsic capacitance that is dictated by the physical periphery of the transistor, common practice is to reduce the size of transistors to increase its cutoff frequency and maximize operating frequency. However, the reduction in size of the transistor limits its power output capability. Therefore, to meet the system level power requirement, smaller periphery transistors need to be combined at a cost of increasing circuit footprint and DC power relative to designs that only requires a single larger transistor.

SUMMARY

In one aspect of the invention, a method is provided for configuring a transistor device to operate above its first cutoff frequency. The method comprises of selecting a desired operating frequency range and a desired output power for a transistor associated with the transistor device, analyzing the effects of phase velocity mismatch on the overall gain of a plurality of different sized transistors, and evaluating the primary and secondary gain regions of the plurality of different sized transistors. The method further comprises selecting a transistor sized to provide the desired output power at or close to the desired operating frequency range based on the analysis of the phase velocity mismatch and the evaluation of the primary and secondary gain regions.

In another aspect of the present invention, a method is provided for operating a transistor device above a first cutoff frequency of at least one transistor of the transistor device. The method comprises a substrate, a first terminal disposed on the substrate, a second terminal disposed on the substrate and a control terminal disposed on the substrate and spaced between the first terminal and the second terminal, the physical dimensions associated with the at least one of the first terminal, the control terminal and the second terminal are configured to provide at least one of a predetermined first frequency cutoff of a primary gain region of the at least one transistor, and a predetermined secondary gain region of the at least one transistor and its associated predetermined secondary frequency cutoff.

In yet another aspect of the present invention, a transistor device is provided having at least one transistor. The at least one transistor comprises a substrate, a source terminal disposed on the substrate, a drain terminal disposed on the substrate, and a gate terminal disposed on the substrate and spaced between the source terminal and the gate terminal. The dimensions associated with the drain terminal are modified to adjust at least one of a first frequency cutoff of a primary gain region of the at least one transistor, a secondary gain region of the at least one transistor and a secondary frequency cutoff of the at least one transistor.

DETAILED DESCRIPTION

The present invention relates to transistor devices configured to operate at frequencies above a typical first cutoff frequency associated with one or more transistors in the transistor device. A transistor device is defined herein as a device that includes one or more transistors configured to operate as a functional circuit. The transistor devices can include a variety of different circuit types having one or more transistors. For example, the transistor device can be amplifiers (e.g., power amplifier devices, low noise amplifier devices) formed from a single transistor or multiple transistors, which can be employed in transmitters and/or receivers in addition to a variety of other electronic systems. The transmitters and/or receivers can be employed in communication systems to provide for higher carrier frequencies allowing for modulation of higher data rate communication signals to increase communication bandwidth. The transmitters and/or receivers can also be employed in radar systems. In radar systems, the ability for transistor devices to operate at higher frequency allows the contraction of physically small but electrically large aperture to form small beam width to enhance tracking resolution.

The transistor(s) associated with the transistor devices can be, for example, any of BJTs, JFETs, MOSFETS, HBTs and HEMTs. The first cutoff frequency is a frequency point where the gain of the transistor falls to a zero decibel (dB) gain point. For example, for some transistors, such as BJTs, and HBTs, this point is referred to as F(t), which is the zero dB current gain point. For other transistor types, such as JFETs, MOSFETs, and HEMTs, this point is referred to as FMax, which is the zero dB power gain point.

The present invention employs a new transistor model that accounts for phase velocity mismatch associated with operating transistors at substantial high frequencies. Typical transistor models assume that a given signal is distributed uniformly across components, for example, gate, source, drain of JFETs, MOSFETS, and HEMTs and, for example, base, emitter, collector of BJTs and HBTs. However, at high frequencies, the given signal propagates and can have different values at different points across the transistor device since the wavelength of the signal approaches the width of the transistor. Additionally, typical transistor models assume that a transistor is unusable at frequencies above the first cutoff frequency. The present invention can employ secondary gain regions beyond the first frequency cutoff point to amplify transmit and/or receive signals. Secondary gain regions are an operating bandwidth region that has a positive gain at frequencies greater than the typical first cutoff frequency of the transistor. Additionally, methods are provided for configuring dimensions of the transistor to tune a given secondary gain region, or to extend the first frequency cutoff point of a primary or normal gain region of the transistor. The primary or normal gain region is the typical operation bandwidth of the transistor prior to the first cutoff frequency.

The present invention is useful in Millimeter Wave (MMW) and sub-MMW application fabricated on Monolithic Microwave Integrated Circuits (MMICs), and can provide high performance and high power transceiver electronics. The present invention provides for operating larger transistors at secondary gain regions as opposed to the inefficient combining of smaller transistors to achieve similar power, thus resulting in higher performance and higher output power with a smaller MMIC footprint than employing a group of smaller transistors operating in the primary gain region.

Figure 1:
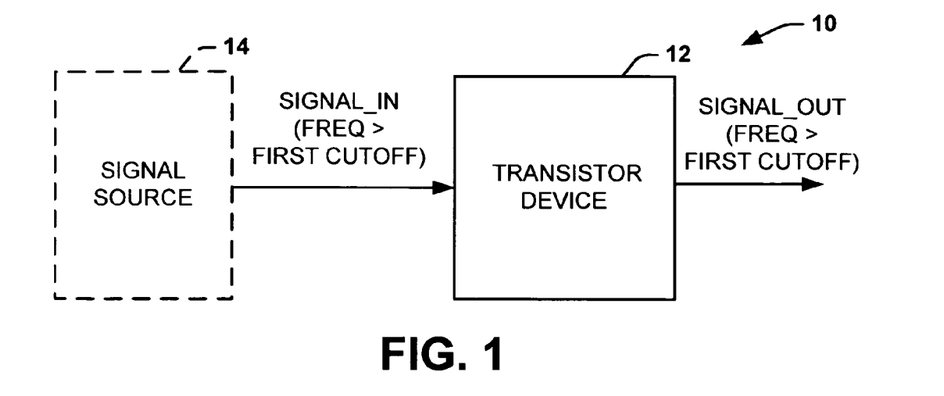
FIG. 1 illustrates a block diagram of a system for operating a transistor device above a first cutoff frequency in accordance with an aspect of the present invention.

FIG. 1 illustrates a block diagram of a system 10 for operating a transistor device 12 above a first cutoff frequency in accordance with an aspect of the present invention. The transistor device 12 includes one or more transistors configured to receive an input signal having a frequency above a first cutoff frequency associated with the one or more transistors in the transistor device 12, and to provide an output signal that is an amplified version of the input signal at the frequency above the first cutoff frequency. The system 10 can include an optional signal source 14 that provides the input signal at the frequency above a first cutoff frequency associated with the one or more transistors in the transistor device 12. The signal source 14 can be local or remote to the transistor device 12. The one or more transistors are configured by evaluating the phase velocity mismatch associated with one or more transistors forming the transistor device 12, and modifying transistor dimensions to tune the transistor to operate within a desired frequency band.

This can be accomplished by evaluating the phase velocity mismatch associated with the one or more transistors, and configuring the dimensions of the one or more transistors to tune the one or more transistors to extend the first cutoff frequency. Alternatively, this can be accomplished by evaluating the phase velocity mismatch associated with the one or more transistors and employing a secondary gain region of the one or more transistors. The secondary gain region is an operating bandwidth region that has a positive gain at frequencies greater than the first cutoff frequency of the transistor. The transistor device can have a plurality of secondary gain regions beyond the zero dB gain frequency cutoff point of the primary operating gain region of the transistor device, each secondary gain region having an associated secondary cutoff frequency. Furthermore, the secondary gain regions can be tuned by modifying transistor dimensions to adjust the frequency bandwidth from its secondary gain region.

As stated above, the present invention employs a new transistor model that accounts for phase velocity mismatch associated with operating transistors at substantially high frequencies. It has been determined that all parallel-coupled lines associated with the transistor terminals support a quasi transverse electromagnetic (TEM) mode of operation that has an even mode and odd mode property, and that the even mode characteristic impedance $Z_{oe}$ and odd mode characteristic impedance $Z_{oo}$ can be extracted and measured under each mode excitation to evaluate the composite characteristic impedance. The even mode phase velocity $v_{pe}$ and the odd mode phase velocity $v_{po}$ and the total characteristic impedance $Z_o$ can be evaluated as follows:

$$v_{pe} = \frac{1}{Z_{oe}\sqrt{C_{ds} \cdot C_{gs}}} \qquad \text{EQ. 1}$$

$$v_{po} = \frac{1}{Z_{oo}\left(\sqrt{C_{ds} \cdot C_{gs}} + 2C_{gd}\right)} \qquad \text{EQ. 2}$$

$$Z_o = \sqrt{Z_{oe}Z_{oo}} \qquad \text{EQ. 3}$$

where $C_{DS}$ is the drain-to-source capacitance, $C_{GS}$ is the gate-to-source capacitance, $C_{GD}$ is the gate-to-drain capacitance, $Z_{oe}$ is the even mode characteristic impedance, and $Z_{oo}$ is the odd mode characteristic impedance.

It has also been determined that the gain (G) of the transistor can be modeled by determining the normal multi-pole device transconductance (gm) gain of the transistor multiplied by a phase velocity mismatch vector. An exemplary gain equation (EQ. 4) is provided below for a HEMT transistor formed on a gallium Arsenide (GaAs) substrate having a dielectric constant $\epsilon_r=12.9$, and an effective dielectric constant $\epsilon_{eff}=9.0$, a device width of 1000 μm and device gm poles of 5 and 80 GHz.

$$G = \frac{60}{\left(1+\frac{f}{5\times 10^9}\right)\left(1+\frac{f}{80\times 10^9}\right)^n} \frac{\left(1+e^{-j\omega\left(\frac{1}{v_{pe}}-\frac{1}{v_{po}}\right)W}\right)}{2} \quad \text{EQ. 4}$$

As can be determined by EQ. 4, if $v_{pe}$ is equal to $v_{po}$ then the phase velocity mismatch portion of EQ. 4 becomes one and the phase velocity does not effect the overall gain of the transistor. However, as illustrated in EQ. 1 and EQ. 2, the additional term $C_{GD}$ in the odd mode phase velocity equation illustrates that the phase velocity effect to the transistor gain cannot in reality be eliminated but can only be mitigated by reducing the gate-to-drain capacitance. Furthermore, the width of the device affects the phase velocity mismatch vector. Therefore, the phase velocity mismatch vector can be tuned by modifying the width of the transistor and modifying the gate-to-drain capacitance $C_{GD}$. Additionally, it is to be appreciated that the phase velocity mismatch vector causes the gain to oscillate every time the term $$\omega\left(\frac{1}{v_{pe}}-\frac{1}{v_{po}}\right)W = 2\pi N,$$

where $\omega=2\pi f$, f is the frequency and W is the width of the transistor, and N is an integer from 0 to $\infty$, such that the transistor can have a plurality of usable secondary gain regions above the first cutoff frequency. Additionally, it may be desirable to mitigate the effects of the velocity mismatch vector by adjusting the gate-to-drain capacitance and the width based on the frequency to provide that the term $$\omega\left(\frac{1}{v_{pe}}-\frac{1}{v_{po}}\right)W < 0.5$$

to maximize the first cutoff frequency. Generically, EQ. 4 can be represented as follows:

$$G = A^* \frac{\left(1+e^{-j\omega\left(\frac{1}{v_{pe}}-\frac{1}{v_{po}}\right)W}\right)}{2} \quad \text{EQ. 5}$$

where A is the scalar gain (gm) or term of the transistor and $$\frac{\left(1+e^{-j\omega\left(\frac{1}{v_{pe}}-\frac{1}{v_{po}}\right)W}\right)}{2}$$

is the phase velocity mismatch vector or term.

Figure 2:
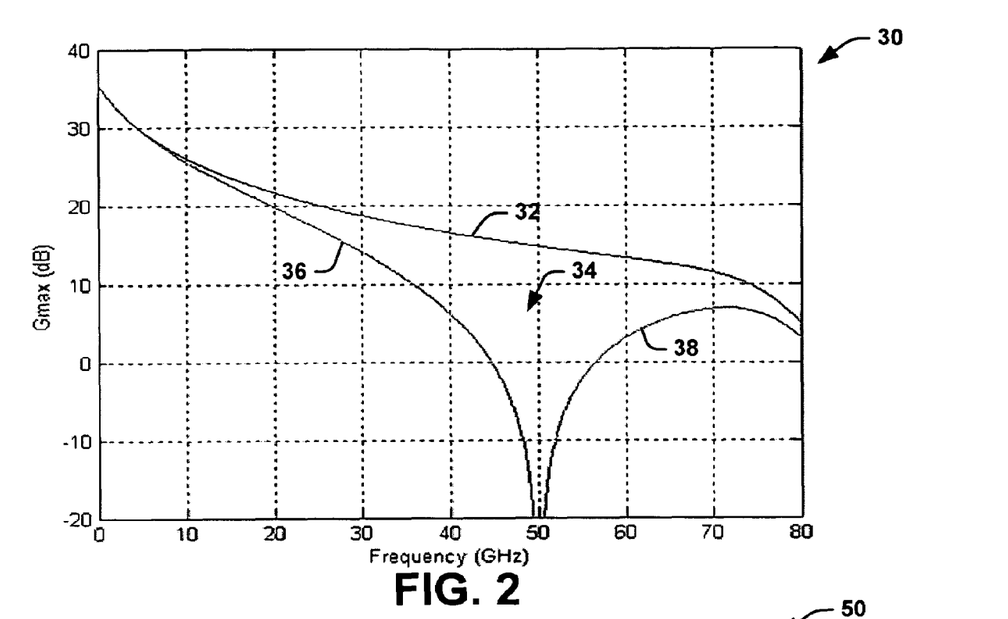
FIG. 2 illustrates a graph of predicted transistor device gain versus frequency with and without phase velocity matching of an exemplary HEMT transistor.

FIG. 2 illustrates a graph 30 of gain versus frequency of an exemplary HEMT transistor with a gain response as illustrated in EQ. 4. A theoretical curve 32 of gain response (G) of the HEMT transistor without the effects of phase velocity mismatch is illustrated with a first cutoff frequency that extends beyond 80 GHZ. An actual curve 34 of a gain response (G) of the HEMT transistor accounting for the effects of phase velocity mismatch has a typical first cutoff frequency of about 45 GHZ (e.g., above zero dB) in a primary gain region illustrate by a first curve 36. However, the actual curve 34 of the gain response (G) also includes a secondary gain region illustrated by a second curve 38. Therefore, the HEMT transistor can be operated in the secondary gain region at frequencies above a first cutoff frequency of the HEMT transistor. It is also to be appreciated that the phase velocity mismatch vector illustrated in EQ. 4 is an oscillating term such that the secondary gain region will repeat or oscillate over frequency.

Figure 3:
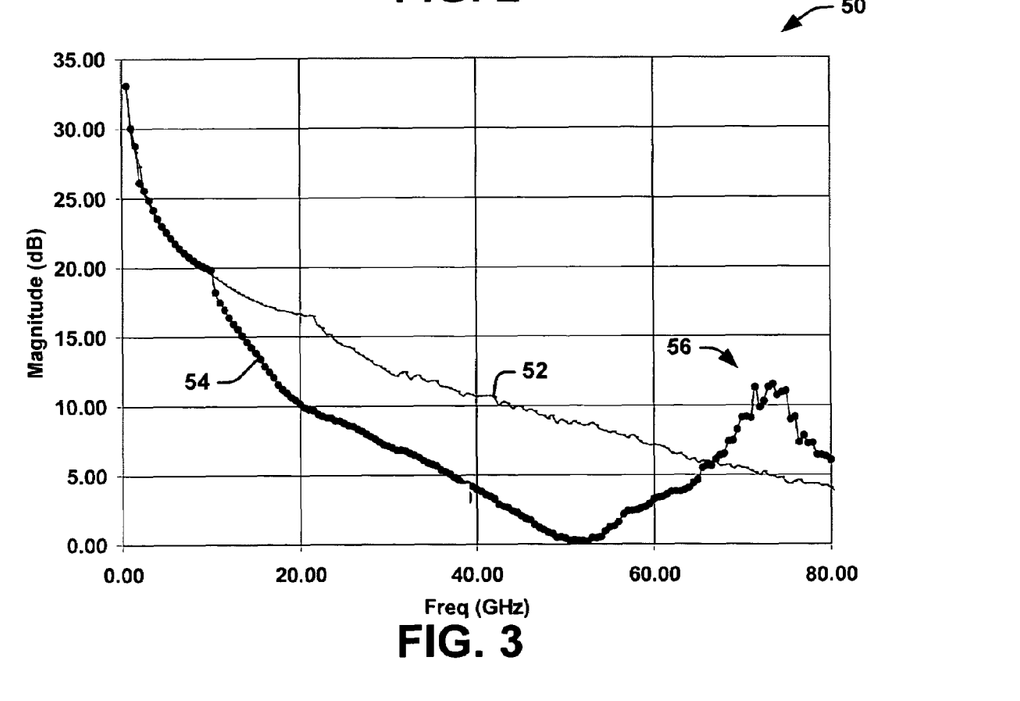
FIG. 3 illustrates a graph of gain versus frequency of a first exemplary HEMT transistor device and a second exemplary HEMT transistor in accordance with an aspect of the present invention.

FIG. 3 illustrates a graph 50 of gain versus frequency of a first exemplary HEMT transistor device and a second exemplary HEMT transistor device dimensioned to be larger than the first HEMT transistor device. A first gain versus frequency curve 52 is associated with the first transistor device and a second gain versus frequency curve 54 is associated with the second transistor device. The first transistor device includes four stacked HEMTs with a width of about 100 microns with a length of about 0.15 microns. The second transistor includes four stacked HEMTs with a width of about 250 microns with a length of about 0.15 microns. As illustrated in the graph 50, the first transistor has a first cutoff frequency that is higher than first cutoff frequency of the second transistor. For example, the second transistor has a first cutoff frequency around 50 GHz at a primary gain region, while the first cutoff frequency of the first transistor at a primary gain region is greater than 80 GHz. However, the second transistor has a second gain region from about 65 GHz to about 80 GHz that has a gain that greater than the first transistor at the primary gain region of the first transistor at these frequencies. It is further appreciated that the second transistor can provide power that is substantially greater than the first transistor. For example, in certain applications, it would take many smaller transistors grouped together to provide the substantially same power as one large transistor. Therefore, the footprint of the circuit (e.g., MMIC) would be much larger employing the smaller transistors grouped together than one or more larger transistors. Therefore, the second larger transistor can be employed in applications with smaller footprint sizes that require higher power and higher frequency than can be provided with the grouping of the smaller transistors by utilizing one of the secondary gain regions of the second larger transistor.

Figure 4:
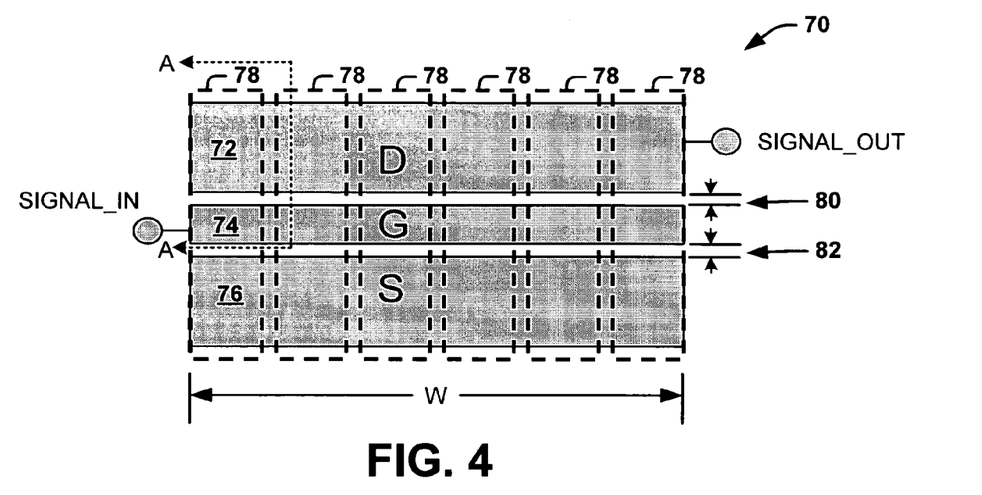
FIG. 4 illustrates a top plan view of a HEMT transistor in accordance with an aspect of the present invention.

FIG. 4 illustrates a top plan view of a HEMT transistor 70 in accordance with an aspect of the present invention. The HEMT transistor includes a drain terminal 72 (or first terminal) spaced apart from a gate terminal 74 (or drain terminal) by a distance 30 and a source terminal 76 (or second terminal) spaced apart from the gate terminal 74 by a distance 82. The transistor 70 and the fingers of the drain terminal 72, gate terminal 74 and the source terminal 76 have a length W associated with the transistor 70. The drain terminal 72, the gate terminal 74 and the source terminal 76 are formed from a conductive material, such as a metal that contributes to capacitances associated with the transistor 70.

Figure 5:
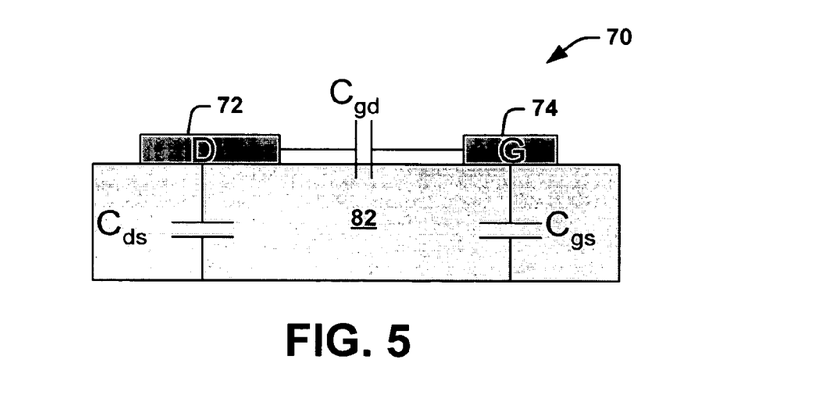
FIG. 5 illustrates a cross-sectional view of the transistor of FIG. 4 along dashed lines A-A.

FIG. 5 illustrates a cross-sectional view of the transistor 70 along dashed lines A-A. The source terminal 76 can be coupled to ground through the substrate 82, which is not shown in FIG. 5. The drain terminal 72, the gate terminal 74 and the source terminal 76 are disposed on a substrate 82. As illustrated in FIG. 5, a capacitance CDS is formed between the drain terminal 72 and the source terminal 76, a capacitance $C_{GS}$ is formed between the gate terminal 74 and the source terminal 76, and a capacitance CGD is formed between the gate terminal 74 and the drain terminal 72.

FIG. 4 illustrates that the transistor 70 can be modeled as a plurality of device dimension tunable units 78, which can be modified to adjust the primary gain region and/or secondary gain regions of the transistor 70. As stated above, the effects of the phase velocity mismatch vector on the first cutoff frequency of the transistor can be modified by adjusting the capacitance $C_{GD}$, for example, by modifying the distance 80 between the gate and the drain and/or modifying the width W of the transistor. Therefore, the typical first cutoff frequency of the transistor associated with the primary gain region can be extended and/or one or more associated secondary gain regions can be tuned to a desired frequency range that is greater than the first cutoff frequency by modifying the gate-to-drain capacitance $C_{GD}$ or the width W of the transistor.

It is to be appreciated that the transistor 70 can be a BJT or HBT with the first terminal being a collector terminal, the second terminal being an emitter terminal and the control terminal being a base terminal, such that the typical first cutoff frequency of the transistor associated with the primary gain region can be extended and/or one or more associated secondary gain regions can be tuned to a desired frequency range that is greater than the first cutoff frequency by modifying the base-to-collector capacitance or the width W of the transistor.

Figure 6:
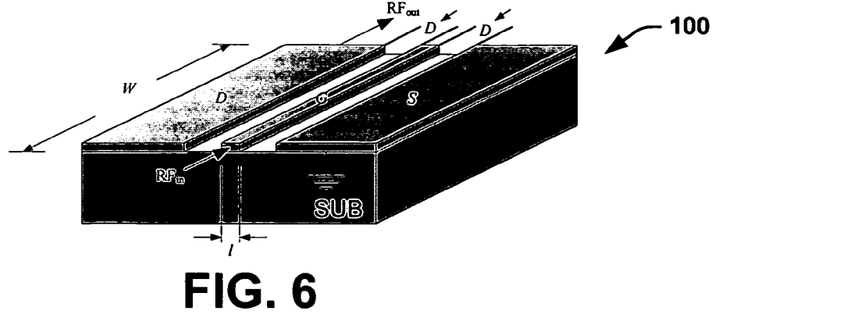
FIG. 6 illustrates a typical transistor configuration in accordance with an aspect of the present invention.

FIGS. 6-9 illustrate a variety of different transistor configurations in accordance with various aspects of the present invention. FIG. 6 illustrates a typical transistor configuration 100 having a width (W) and a length (l). The transistor configuration 100 includes a drain terminal (D), a gate terminal (G) and a source terminal (S) disposed above a substrate (SUB). The drain terminal and the source terminal have substantially similar sizes and areas with each of the drain terminal and source terminal being separated from the gate terminal by a distance D. The source terminal is grounded, such that the transistor 100 is configured to operate as an amplifier. An RF input signal ($RF_{IN}$) is provided to the gate as input and an RF output signal ($RF_{OUT}$) is provided as output of the transistor, such that the $RF_{OUT}$ signal is an amplified version of the $RF_{IN}$ signal at a given frequency range.

It is to be appreciated that if the width (W) of the transistor is selected to be ¼ wavelength associated with the input frequency, then the transistor 100 performs as a near perfect impedance transformer. Therefore, the transistor 100 can be configured as an amplifier device without the need for a impedance matching network. This allows for providing an amplifier with a reduction in circuit footprint size (or die area), which can provide a high output power and high frequency response when the transistor 100 is configured to operate in one or more secondary gain regions.

Alternatively, the transistor 100 can be implemented into another transistor device and employed to operate at frequencies above the first cutoff frequency associated with the primary gain region at one or more secondary gain regions. It is appreciated that the transistor can be tuned to increase the first cutoff frequency or to modify one or more secondary gain regions and associated secondary cutoff frequencies by modifying the width and/or gate-to-drain capacitance $C_{GD}$.

Figure 7:
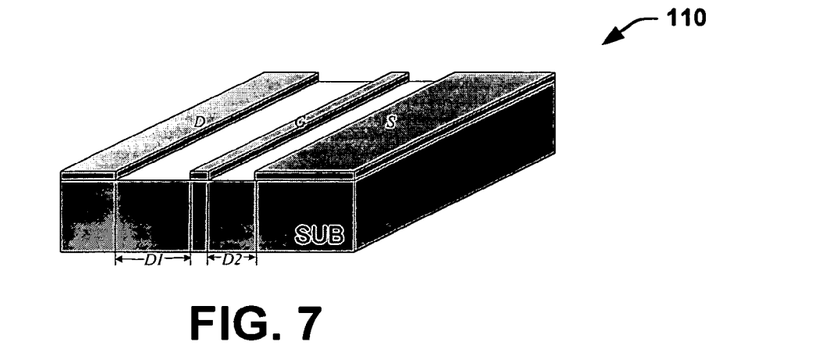
FIG. 7 illustrates a first modified transistor configuration in accordance with an aspect of the present invention.

FIG. 7 illustrates a first modified transistor configuration 110 in accordance with an aspect of the present invention. The first modified transistor configuration 110 includes similar components as the typical transistor configuration 100 of FIG. 6. However, the first modified transistor configuration 110 provides for increasing a distance D1 between the gate terminal and the drain terminal relative to a distance D2 between the gate terminal and the source terminal, such that D1>D2. An increase between the distance of the gate terminal and the drain terminal causes a decrease in the gate-to-drain capacitance of the transistor 110 relative to transistor 100, which results in mitigation of the effects of the phase velocity mismatch vector in EQ. 5. This can provide for increasing the first cutoff frequency of the primary gain region of the transistor 110 in addition to increasing the secondary cutoff frequencies associated with one or more secondary gain regions of the transistor 110.

It is to be appreciated that the thickness of the drain terminal can also be reduced to mitigate the gate-to-drain capacitance of the transistor 110. It is further appreciated that the distance D1 between the gate terminal and the drain terminal can be decreased relative to the distance D2 between the gate terminal and the source terminal to tune or shift the frequency range of the primary gain region or one or more secondary gain regions and associated cutoff frequencies based on a desired application.

Figure 8:
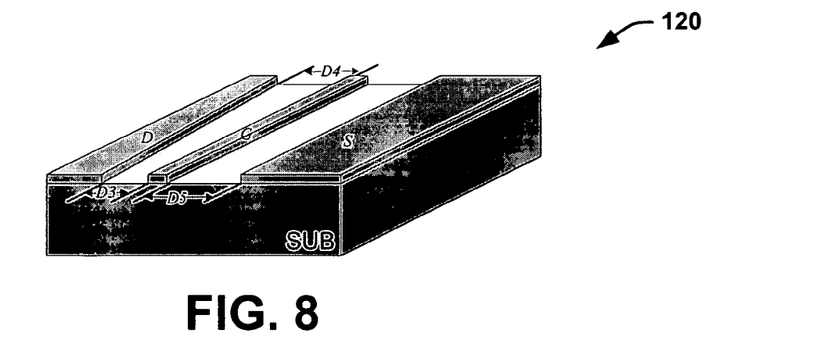
FIG. 8 illustrates a second modified transistor configuration in accordance with an aspect of the present invention.

FIG. 8 illustrates a second modified transistor configuration 120 in accordance with an aspect of the present invention. The second modified transistor configuration 120 includes similar components as the typical transistor configuration 100 of FIG. 6. However, the second modified transistor configuration 120 provides for a drain terminal that has distance D3 between the gate terminal and the drain terminal on a first end that is different than a distance D4 between the gate terminal and the source terminal at a second end, such that D3>D4 provides for a generally tapered shaped drain terminal. A distance D5 between the gate terminal and the source terminal can be the same or different than the distance D3 or the distance D4. The transistor 120 operates normally in low frequencies but provides a lower gate-to-drain capacitance at higher frequencies than the typical transistor configuration 100 due to the generally tapered shaped of the drain terminal. The amount of taper of the drain terminal can be adjusted to tune the first cutoff frequency of the primary gain region of the transistor in addition to tuning the secondary gain regions and associated secondary cutoff frequencies. It is to be appreciated that although the tapering of the drain terminal is illustrated in two-dimensions, the tapering can be over three dimensions, such that the thickness of the drain terminal can be reduced at certain portions relative to other portions.

Figure 9:
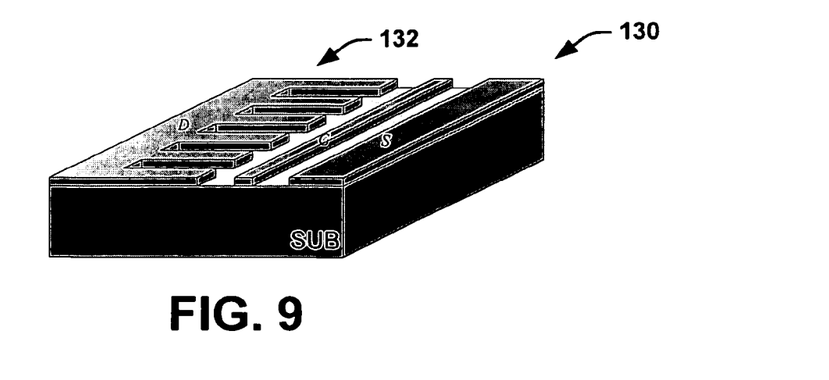
FIG. 9 illustrates a third modified transistor configuration in accordance with an aspect of the present invention.

FIG. 9 illustrates a third modified transistor configuration 130 in accordance with an aspect of the present invention. The third modified transistor configuration 130 includes similar components as the typical transistor configuration 100 of FIG. 6. However, the third modified transistor configuration 130 provides for a corrugated drain terminal 132 that has a plurality of corrugated openings arranged to mitigate the gate-to-drain capacitance of the transistor 130. The size of the openings can be dimensioned based on a particular application and desired performance to provide for a desired reduced gate-to-drain capacitance. Additionally, the size and frequency of the openings can be selected to adjust or tune the first cutoff frequency of the primary gain region of the transistor 130 in addition to tuning the secondary gain regions and associated secondary cutoff frequencies.

It is to be appreciated that the examples illustrated in FIGS. 7-9 are but a few examples of modified transistor configurations, such that a number of different modifications to transistor configurations can be contemplated in accordance with the present invention. Additionally, combinations of the gate-to-drain spacing, terminal thicknesses, the tapered drain terminal and the corrugated drain terminal can be employed to modify the gate-to-drain capacitance, and thus the effects of the phase velocity mismatch vector on the overall gain of the transistor.

Although the present examples illustrated in FIGS. 1-9 and EQs. 1-5 are illustrated with respect to HEMTs, JFETs, and MOSFETS transistor types, the present invention is applicable for modeling and tuning other transistor types, such as BJTs and HBTs, such that tuning can be achieved by modifying transistor dimensions to effect capacitances associated with the base, emitter, collector and width of the respective BJT or HBT. In particular, the adjustment of the base-to-collector capacitance of the BJT or HBT is analogous to the gate-to-drain capacitance of the HEMT, JFET, and MOSFET, such that phase velocity mismatch can be modified by adjusting the width and base-to-collector capacitance of the BJT or HBT.

Figure 10:
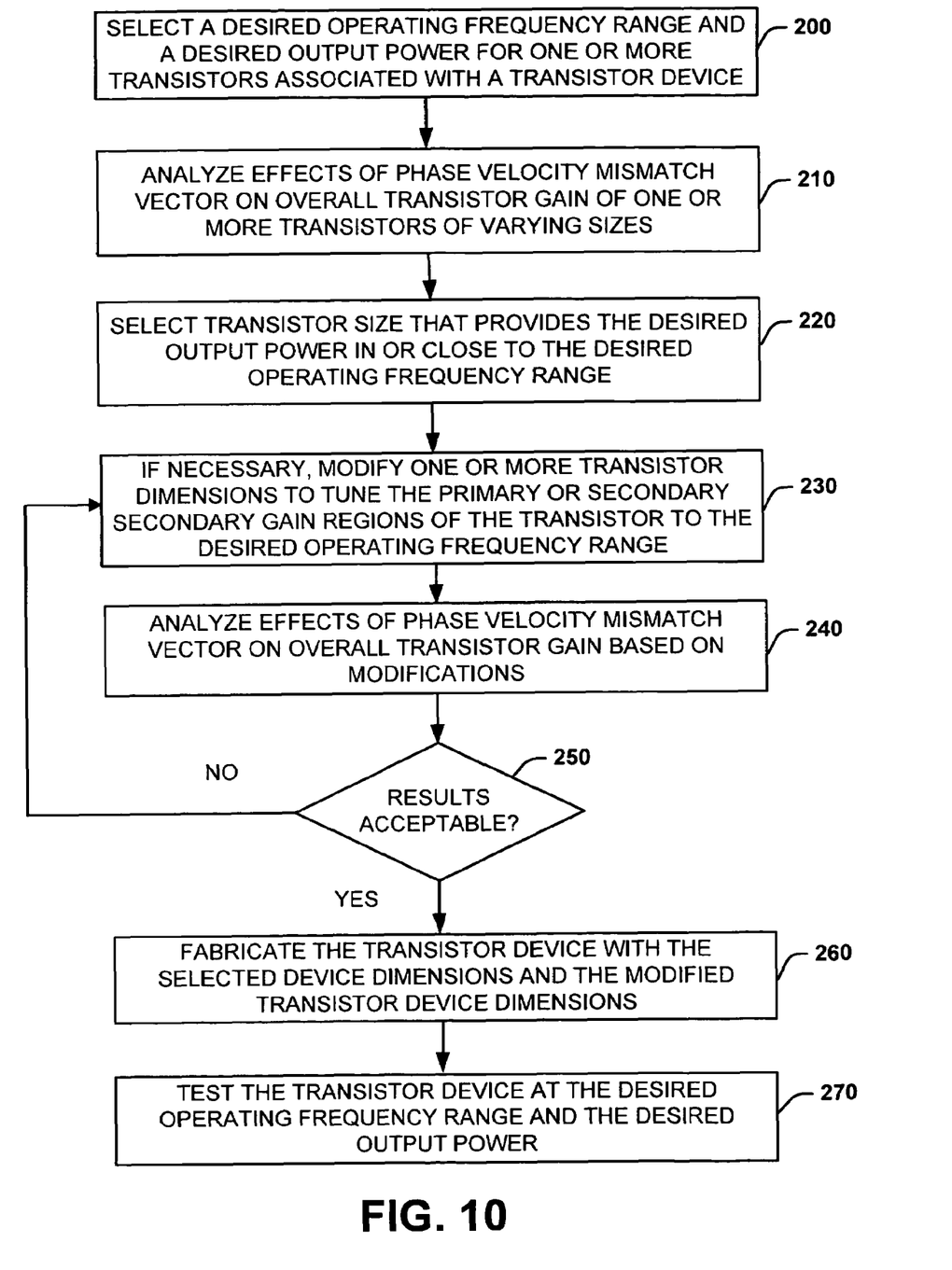
FIG. 10 illustrated a methodology for configuring a transistor device to operate above a first cutoff frequency in accordance with an aspect of the present invention.
Figure 11:
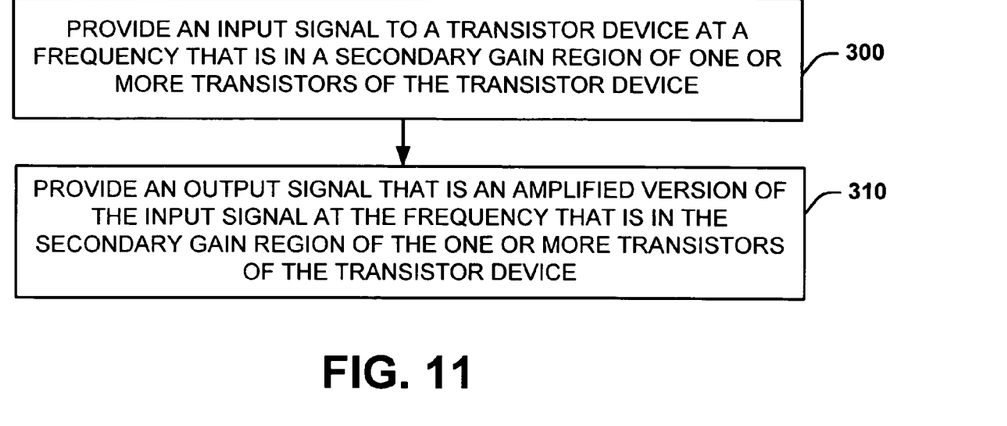
FIG. 11 illustrated a methodology for operating a transistor device above a first cutoff frequency in accordance with an aspect of the present invention.

In view of the foregoing structural and functional features described above, methodologies in accordance with various aspects of the present invention will be better appreciated with reference to FIGS. 10-11. While, for purposes of simplicity of explanation, the methodologies of FIGS. 10-11 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 10 illustrated a methodology for configuring a transistor device to operate above a first cutoff frequency in accordance with an aspect of the present invention. The methodology begins at 200. At 200, a desired operating frequency range and a desired output power are selected for one or more transistors associated with a transistor device. At 210, the effect of phase velocity mismatch on overall transistor gain is analyzed for one or more transistors of varying sizes. For example, the effect of phase velocity mismatch on overall transistor gain can be analyzed by evaluating EQ. 5 for each of the one or more transistors and by analyzing the primary gain region and the secondary gain regions associated with the gain response of the transistor. At 220, a transistor size is selected that provides the desired output power in or close to the desired operating frequency range. The methodology then proceeds to 230.

At 230, if necessary, one or more transistor dimensions can be modified to tune the primary or secondary gain regions of the transistor to the desired operating frequency range. For example, the gate-to-drain capacitance or base-to-collector capacitance can be modified by employing a variety of different techniques, such as those discussed and illustrated in reference to FIGS. 7-9. Additionally, the width of the transistor can be modified to tune the primary or secondary gain regions. The methodology then proceeds to 250 to determine if the modifications have provided acceptable results. If the modifications has not provided acceptable results (NO), the methodology repeats 230 and 240, until the modification have provided acceptable results. It is appreciated that if acceptable results cannot be achieved, a new transistor size can be selected. If the modifications have provided acceptable results (YES), the methodology proceeds to 260.

At 260, the transistor device is fabricated with one or more of the transistors with the selected transistor size and the modified transistor dimensions. The transistor device can be, for example, one or more amplifiers, one or more VCO's, for example, a communication system, such as a mobile communication system, radar system or an imaging system or other transistor based system having one or more transmitters and/or receivers. At 270, the transistor device is tested at the desired operating frequency range and the desired output power.

FIG. 11 illustrated a methodology for operating a transistor device above a first cutoff frequency in accordance with an aspect of the present invention. At 300, an input signal is provided to a transistor device at a frequency that is in a secondary gain region of one or more transistors of the transistor device. At 310, an output signal is provided that is an amplified version of the input signal at the frequency that is in the secondary gain region of the one or more transistors of the transistor device.

Figure 12:
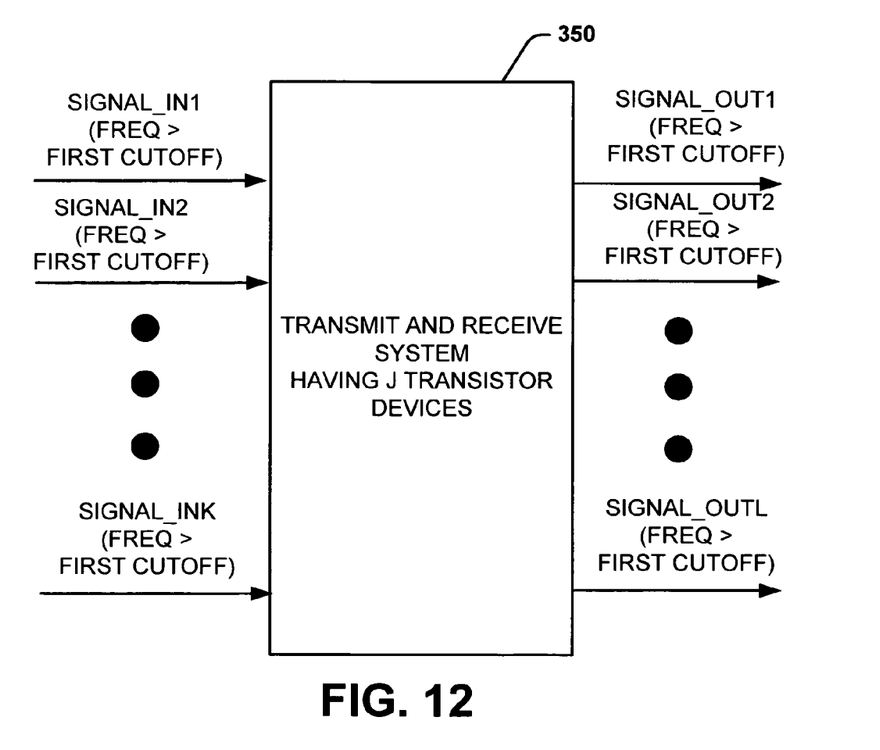
FIG. 12 illustrated a transmitter and receiver system in accordance with an aspect of the present invention.

FIG. 12 illustrates a transmitter and receiver system 350 in accordance with an aspect of the present invention. The system 350 includes J transistor devices, where J is an integer greater than or equal to one. The system 350 is operative to transmit and receive signals at frequencies above a first cutoff frequency of one or more transistors of the J transistor devices employed in the system 350. For example, the one more transistors can be employed in one or more amplifiers that are employed in one or more transmitters (e.g., higher power amplifiers) or in one or more receivers (e.g., lower noise amplifiers). The one or more transistors can be employed in one or more VCOs for controlling timing associated with the system 350, such as transmission timing or sample timing in addition to processing functions of the system 350. The system 350 provides L output signals having frequencies above a first cutoff frequencies of associated output transistors and receives K input signals having frequencies above a first cutoff frequency of associated input transistors, where K and L are integers greater than or equal to one, such that K and L can be equal or not equal and further equal or not equal to J.

The system 350 can be, for example, a communication system, such as a mobile communication system, a radar system or an imaging system. A plurality of transistors can be aligned, spaced apart and operated at secondary gain regions to provide for higher frequency, higher power output signals, while employing a smaller footprint or die area than would be necessary with groups of smaller transistors to provide for a similar output power.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for configuring a transistor device to operate above a first cutoff frequency, the method comprising:
    selecting a desired operating frequency range and a desired output power for a transistor associated with the transistor device;
    analyzing the effects of phase velocity mismatch on the overall gain of a plurality of different sized transistors;
    evaluating the primary and secondary gain regions of the plurality of different sized transistors; and
    selecting a transistor sized to provide the desired output power at or close to the desired operating frequency range based on the analysis of the phase velocity mismatch and the evaluation of the primary and secondary gain regions.

2. The method of claim 1, further comprising modifying at least one transistor dimension to tune at least one of a first frequency cutoff of a primary gain region of the transistor, a secondary gain region of the transistor and a secondary frequency cutoff of the transistor.

3. The method of claim 2, wherein the modifying at least one transistor dimension comprises adjusting a width of the transistor to modify the phase velocity mismatch.

4. The method of claim 2, wherein the modifying at least one transistor dimension results in a modification of a gate-to-drain capacitance of the transistor.

5. The method of claim 2, wherein the modifying at least one transistor dimension results in a modification of a base-to-collector capacitance of the transistor.

6. The method of claim 1, further comprising fabricating the selected transistor with dimensions that adjusts a gate-to-drain capacitance of the transistor.

7. The method of claim 6, wherein the fabricating the selected transistor with dimensions that adjust a gate-to-drain capacitance of the transistor comprises forming a drain terminal spaced apart from a gate terminal a distance that is greater than the gate terminal is spaced apart from a source terminal.

8. The method of claim 6, wherein the fabricating the selected transistor with dimensions that adjust a gate-to-drain capacitance of the transistor comprises forming a drain terminal having a generally tapered shape.

9. The method of claim 6, wherein the fabricating the selected transistor with dimensions that adjust a gate-to-drain capacitance of the transistor comprises forming a corrugated drain terminal.

10. The method of claim 6, wherein the fabricating the selected transistor with dimensions that adjust a gate-to-drain capacitance of the transistor comprises forming a drain terminal having a thickness less than the thickness of at least one of a gate terminal and a source terminal.

11. The method of claim 6, further comprising testing the fabricated transistor for operating at a secondary gain region above a first cutoff frequency of a primary gain region of the transistor.

12. The method of claim 1, further comprising fabricating a plurality of the selected transistor aligned and spaced apart to form a communication system, the plurality of selected transistors being configured to operate as a plurality of amplifiers.

13. The method of claim 1, further comprising fabricating the selected transistor with a width that is ¼ wavelength of an operating frequency within the desired operating frequency range.

14. The method of claim 1, wherein the transistor is one of a bipolar junction transistors (BJTs), a junction field-effect transistors (JFETs), a metal-oxide-semiconductor field-effect transistors (MOSFETS), a heterojunction bipolar transistors (HBTs) and a high electron mobility transistors (HEMTs).

15. A method for operating a transistor device above a first cutoff frequency of at least one transistor of the transistor device, the method comprising:

configuring the at least one transistor to mitigate phase velocity mismatch comprising dimensioning the at least one transistor to tune at least one of a first frequency cutoff of a primary gain region, a secondary gain region and a secondary frequency cutoff of the at least one transistor;

providing an input signal to a transistor device at a frequency that is in a secondary gain region of at least one transistor of the transistor device; and providing an output signal by the at least one transistor that is an amplified version of the input signal at the frequency that is in the secondary gain region of the at least one transistor of the transistor device.

16. The method of claim 15, wherein the transistor device is one of an amplifier and a voltage controlled oscillator.

17. The method of claim 15, wherein the transistor is one of a bipolar junction transistors (BJTs), a junction field-effect transistors (JFETs), a metal-oxide-semiconductor field-effect transistors (MOSFETS), a heterojunction bipolar transistors (HBTs) and a high electron mobility transistors (HEMTs).

18. The method of claim 15, wherein the dimensioning results in modifying a width, a gate-to-drain capacitance and a base-to-collector capacitance of the at least one transistor to mitigate phase velocity mismatch.

* * * * *